United States Patent
Tawara et al.

(10) Patent No.: US 10,665,681 B2
(45) Date of Patent: May 26, 2020

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Takeshi Tawara, Tsukuba (JP); Hidekazu Tsuchida, Yokosuka (JP); Koichi Murata, Yokosuka (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/251,791

(22) Filed: Jan. 18, 2019

(65) Prior Publication Data

US 2019/0237547 A1    Aug. 1, 2019

(30) Foreign Application Priority Data

Jan. 30, 2018    (JP) .................................. 2018-014191

(51) Int. Cl.
*H01L 29/16* (2006.01)
*H01L 29/36* (2006.01)
(Continued)

(52) U.S. Cl.
CPC ...... *H01L 29/1608* (2013.01); *H01L 21/2003* (2013.01); *H01L 29/167* (2013.01);
(Continued)

(58) Field of Classification Search
CPC ............... H01L 29/6634; H01L 21/324; H01L 29/66333; H01L 29/66712; H01L 29/1608; H01L 29/167; H01L 29/861; H01L 29/6606; H01L 29/868; H01L 21/2003; H01L 29/36; H01L 21/0262;
(Continued)

(56) References Cited

U.S. PATENT DOCUMENTS 9,773,873 B1 *    9/2017    Takahashi ............. H01L 29/861
2016/0307993 A1 * 10/2016    Kuribayashi ........... H01L 29/47
2018/0012758 A1    1/2018    Tsuchida et al.

FOREIGN PATENT DOCUMENTS

JP    2017-085047 A    5/2017

* cited by examiner

*Primary Examiner* — Mohammed R Alam
(74) *Attorney, Agent, or Firm* — Rabin & Berdo, P.C.

(57) ABSTRACT

On a front surface of an $n^+$-type starting substrate containing silicon carbide, a pin diode is configured having silicon carbide layers constituting an $n^+$-type buffer layer, an $n^-$-type drift layer, and a $p^+$-type anode layer sequentially formed by epitaxial growth. The $n^+$-type buffer layer is formed by so-called co-doping of nitrogen and vanadium, which forms a recombination center, together with an n-type impurity. The $n^+$-type buffer layer includes a first part disposed at a side of a second interface of the buffer layer with the substrate and a second part disposed at side of a first interface of the buffer layer with the drift layer. The vanadium concentration in the second part is lower than that in the first part. The vanadium concentration in the second part is at most one tenth of the maximum value Vmax of the vanadium concentration in the $n^+$-type buffer layer.

17 Claims, 5 Drawing Sheets

(51) Int. Cl.
  *H01L 21/20* (2006.01)
  *H01L 29/868* (2006.01)
  *H01L 29/66* (2006.01)
  *H01L 29/861* (2006.01)
  *H01L 29/167* (2006.01)

(52) U.S. Cl.
  CPC .......... *H01L 29/36* (2013.01); *H01L 29/6606* (2013.01); *H01L 29/861* (2013.01); *H01L 29/868* (2013.01)

(58) Field of Classification Search
  CPC ......... H01L 21/02581; H01L 21/02579; H01L 21/02576; H01L 21/02505; H01L 21/02529; H01L 21/02447; H01L 21/02378
  See application file for complete search history.

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2018-014191, filed on Jan. 30, 2018, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

A metal oxide semiconductor field effect transistor (MOSFET) is a MOS field effect transistor that includes an insulated gate with a 3-layer structure including a metal, an oxide film, and a semiconductor; and conventionally, it is known that at a parasitic pn junction diode (or body diode) formed by a pn junction between a base region and a drift region of a p-intrinsic-n (pin) diode or a MOSFET, when silicon carbide (SiC) is used as a semiconductor material, due to current that flows in a forward direction during bipolar operation, basal plane dislocations (BPDs) expand in an $n^-$-type drift layer, from an $n^+$-type starting substrate. As a result, bar-shaped stacking faults are generated in the $n^-$-type drift layer, causing forward characteristics to degrade.

To suppress degradation of forward characteristics due to bipolar operation, provision of an $n^+$-type buffer layer between the $n^+$-type starting substrate and the $n^-$-type drift layer has been proposed where the $n^+$-type buffer layer has a higher impurity concentration than that of the $n^-$-type drift layer. The $n^+$-type buffer layer suppresses injection of holes from the $n^-$-type drift layer side to the $n^+$-type starting substrate during bipolar operation, whereby the generation of stacking faults is suppressed. Furthermore, a technique has been proposed in which in addition to a main element that is an n-type dopant, a special element such as boron (B), titanium (Ti), or vanadium (V), etc. that forms recombination centers (hole trapping centers) is added or co-doped to form the $n^+$-type buffer layer and thereby shorten minority carrier (or hole) lifetime and reduce a thickness of the $n^+$-type buffer layer by an amount corresponding to the extent that the minority carrier lifetime is shortened (for example, refer to Japanese Laid-Open Patent Publication No. 2017-085047).

Formation of the $n^+$-type buffer layer by co-doping has been confirmed to suppress the degradation of forward characteristics caused by bipolar operation. However, during epitaxial growth of the $n^+$-type buffer layer by co-doping, the special element for the co-doping may adhere to a component of an epitaxial growth furnace (namely memory effect). Therefore, when the $n^-$-type drift layer is formed by epitaxial growth successively after the epitaxial growth of the $n^+$-type buffer layer, the special element that adhered to the components of the epitaxial growth furnace may be mixed into (or auto-doped to) the $n^-$-type drift layer during epitaxial growth of the $n^-$-type drift layer. When the special element is mixed in the $n^-$-type drift layer, the minority carrier lifetime of the $n^-$-type drift layer at a part mixed with the special element becomes shorter, whereby a problem arises in that the resistance of the $n^-$-type drift layer increases.

According to a method of preventing mixture of the special element into the $n^-$-type drift layer, the components of the epitaxial growth furnace are replaced after epitaxial growth of the $n^+$-type buffer layer (or a different epitaxial growth furnace is used) to again perform epitaxial growth and form the $n^-$-type drift layer on the $n^+$-type buffer layer.

SUMMARY OF THE INVENTION

According to an embodiment of the invention, a silicon carbide semiconductor device has a pn junction through which current flows in a forward direction. The silicon carbide semiconductor device includes a semiconductor substrate being of a first conductivity type and containing silicon carbide; a first first-conductivity-type epitaxial layer being of the first conductivity type and containing silicon carbide, the first first-conductivity-type epitaxial layer provided on one main surface of the semiconductor substrate; a second first-conductivity-type epitaxial layer being of the first conductivity type and containing silicon carbide, the second first-conductivity-type epitaxial layer provided at a surface of the first first-conductivity-type epitaxial layer on a first side of the first first-conductivity-type epitaxial layer, opposite a second side of the first first-conductivity-type epitaxial layer facing toward the semiconductor substrate, a first-conductivity-type impurity concentration of the second first-conductivity-type epitaxial layer being lower than a first-conductivity-type impurity concentration of the first first-conductivity-type epitaxial layer; and a second-conductivity-type layer being of a second conductivity type and containing silicon carbide, the second-conductivity-type layer provided on a first side of the second first-conductivity-type epitaxial layer, opposite a second side of the second first-conductivity-type epitaxial layer facing toward the semiconductor substrate, the second-conductivity-type layer being in contact with the second first-conductivity-type epitaxial layer and forming the pn junction. The first first-conductivity-type epitaxial layer contains, as impurities, a first element that is a first-conductivity-type dopant and a second element that forms a recombination center. A maximum concentration of the first element in the first first-conductivity-type epitaxial layer is at least $1.0 \times 10^{18}/cm^3$ and less than $1.0 \times 10^{19}/cm^3$. A maximum concentration of the second element in the first first-conductivity-type epitaxial layer is at least $1.0 \times 10^{14}/cm^3$ and less than $5.0 \times 10^{18}/cm^3$, and is at most the maximum concentration of the first element in the first first-conductivity-type epitaxial layer. A concentration of the second element in the first first-conductivity-type epitaxial layer is lower in a second part of the first first-conductivity-type epitaxial layer disposed at as side of an interface of the first first-conductivity-type epitaxial layer with the second first-conductivity-type epitaxial layer than in a first part of the first first-conductivity-type epitaxial layer disposed at a side of an interface of the first first-conductivity-type epitaxial layer with the semiconductor substrate, a thickness of the first part of the first first-conductivity-type epitaxial layer being of a range from 0.1 µm to 5 µm.

In the embodiment, the concentration of the second element in the first first-conductivity-type epitaxial layer, at the interface with the second first-conductivity-type epitaxial layer, is at most one tenth of the maximum concentration of the second element in the first first-conductivity-type epitaxial layer.

In the embodiment, the concentration of the second element in the second part of the first first-conductivity-type epitaxial layer decreases from the first part of the first first-conductivity-type epitaxial layer, toward the second first-conductivity-type epitaxial layer.

In the embodiment, a concentration of the first element in the first first-conductivity-type epitaxial layer, at the interface with the second first-conductivity-type epitaxial layer, is at most one tenth of the maximum concentration of the first element in the first first-conductivity-type epitaxial layer.

In the embodiment, the second element is any one of boron, titanium, iron, chromium, or vanadium.

In the embodiment, impurity concentration variation in the second first-conductivity-type epitaxial layer occurs near the interface of the second first-conductivity-type epitaxial layer with the first first-conductivity-type epitaxial layer.

In the embodiment, the impurity concentration variation in the second first-conductivity-type epitaxial layer is at least ±10% of an average value of the first-conductivity-type impurity concentration in the second first-conductivity-type epitaxial layer.

In the embodiment, the impurity concentration variation in the second first-conductivity-type epitaxial layer occurs in a range within 3 μm from the interface of the second first-conductivity-type epitaxial layer with the first first-conductivity-type epitaxial layer.

According to another embodiment of the invention, a method of manufacturing a silicon carbide semiconductor device having a pn junction through which current flows in a forward direction, includes forming by epitaxial growth on one main surface of a semiconductor substrate being of a first conductivity type and containing silicon carbide, a first first-conductivity-type epitaxial layer containing, as impurities, a first element that is a first-conductivity-type dopant and a second element that forms a recombination center, a maximum concentration of the first element being at least $1.0 \times 10^{18}/cm^3$ and less than $1.0 \times 10^{19}/cm^3$, a maximum concentration of the second element being at least $1.0 \times 10^{14}/cm^3$ and less than $5.0 \times 10^{18}/cm^3$ and at most the maximum concentration of the first element; forming a second first-conductivity-type epitaxial layer by epitaxial growth on a surface of the first first-conductivity-type epitaxial layer, an impurity concentration in the second first-conductivity-type epitaxial layer being lower than an impurity concentration in the first first-conductivity-type epitaxial layer; and forming a second-conductivity-type layer in a surface layer or on a surface of the second first-conductivity-type epitaxial layer, and forming the pn junction between the second-conductivity-type layer and the second first-conductivity-type epitaxial layer. Forming the first first-conductivity-type epitaxial layer includes: setting a concentration of the second element in the first first-conductivity-type epitaxial layer to be lower in a second part of the first first-conductivity-type epitaxial layer disposed at a side of an interface of the first first-conductivity-type epitaxial layer with the second first-conductivity-type epitaxial layer than in a first part of the first first-conductivity-type epitaxial layer disposed at a side of an interface of the first first-conductivity-type epitaxial layer with the semiconductor substrate; and setting a thickness of the first part of the first first-conductivity-type epitaxial layer to be in a range from 0.1 μm to 5 μm.

In the embodiment, forming the first first-conductivity-type epitaxial layer includes setting the concentration of the second element in the first first-conductivity-type epitaxial layer, at the interface with the second first-conductivity-type epitaxial layer, to be at most one tenth of the maximum concentration of the second element in the first first-conductivity-type epitaxial layer.

In the embodiment, forming the first first-conductivity-type epitaxial layer includes: performing a first epitaxial growth of the first first-conductivity-type epitaxial layer in a gas atmosphere containing a first gas containing the first element and a second gas containing the second element; performing a first suspension of a supply of the second gas to the gas atmosphere in a midst of the first epitaxial growth of the first first-conductivity-type epitaxial layer; and performing a second epitaxial growth of the first first-conductivity-type epitaxial layer successively in the gas atmosphere to which the supply of the second gas is suspended.

In the embodiment, performing the first epitaxial growth includes forming the first part of the first first-conductivity-type epitaxial layer. Performing the second epitaxial growth includes forming the second part of the first first-conductivity-type epitaxial layer successively with forming the first part.

In the embodiment, the method further includes suspending from a start of performing the first epitaxial growth until completion of performing the second epitaxial growth, a supply of the first gas to the gas atmosphere in a midst of epitaxial growth of the first first-conductivity-type epitaxial layer.

In the embodiment, the method further includes setting a concentration of the first element in the first first-conductivity-type epitaxial layer, at the interface with the second first-conductivity-type epitaxial layer, to be at most one tenth of the maximum concentration of the first element in the first first-conductivity-type epitaxial layer.

In the embodiment, the method further includes cleaning an epitaxial growth furnace used in forming the first first-conductivity-type epitaxial layer, the epitaxial growth furnace being cleaned after forming the first first-conductivity-type epitaxial layer and before forming the second first-conductivity-type epitaxial layer. Forming the second first-conductivity-type epitaxial layer includes forming the second first-conductivity-type epitaxial layer by epitaxial growth using the epitaxial growth furnace after cleaning.

In the embodiment, forming the second first-conductivity-type epitaxial layer includes forming the first first-conductivity-type epitaxial layer by epitaxial growth using an epitaxial growth furnace different from that used in forming the first first-conductivity-type epitaxial layer.

In the embodiment, the second element is any one of boron, titanium, iron, chromium, or vanadium.

Objects, features, and advantages of the present invention are specifically set forth in or will become apparent from the following detailed description of the invention when read in conjunction with the accompanying drawings.

DETAILED DESCRIPTION OF THE INVENTION

Figure 4:
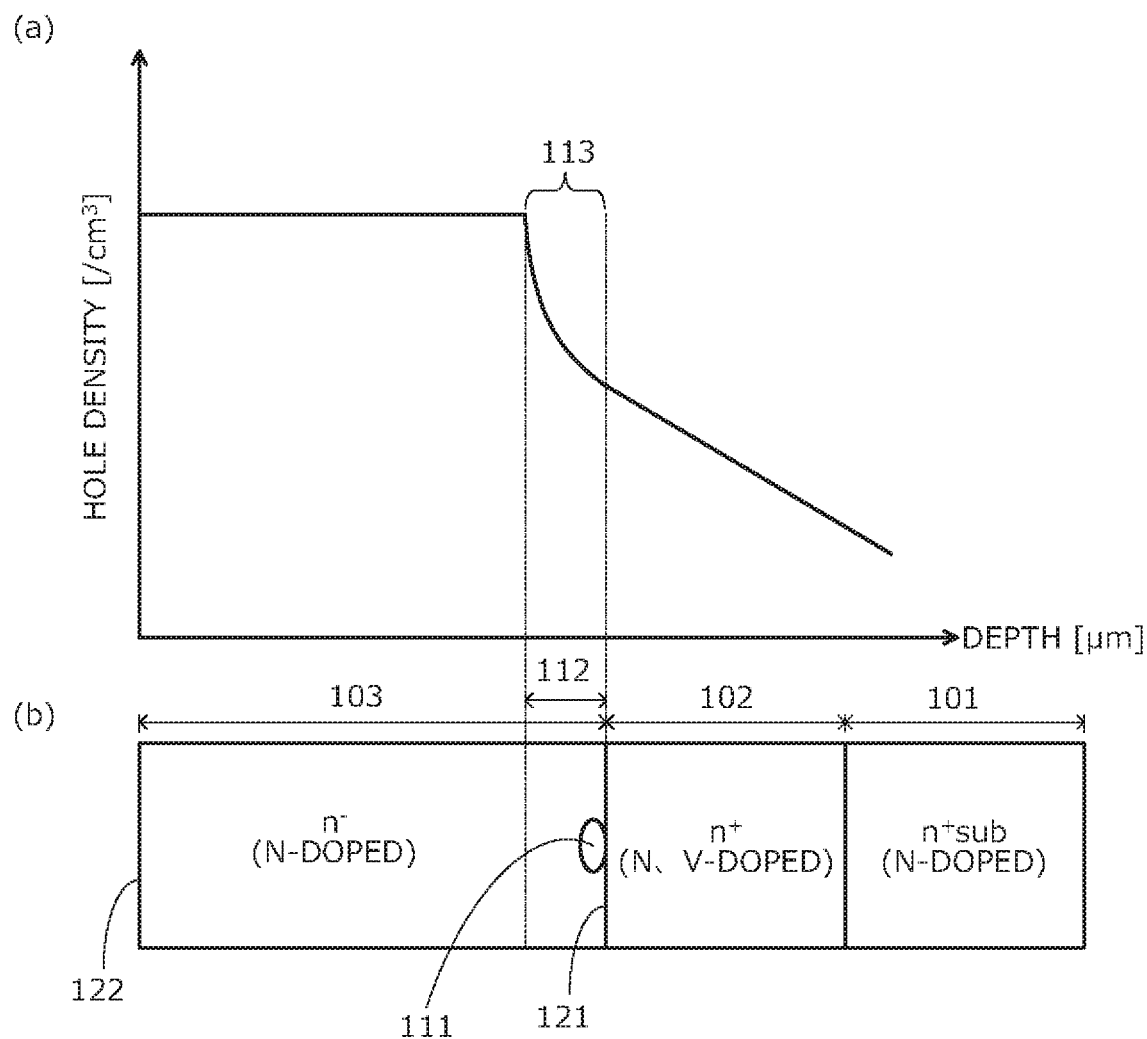
FIG. 4 is a diagram depicting problematic points of a conventional silicon carbide semiconductor device.
Figure 5:
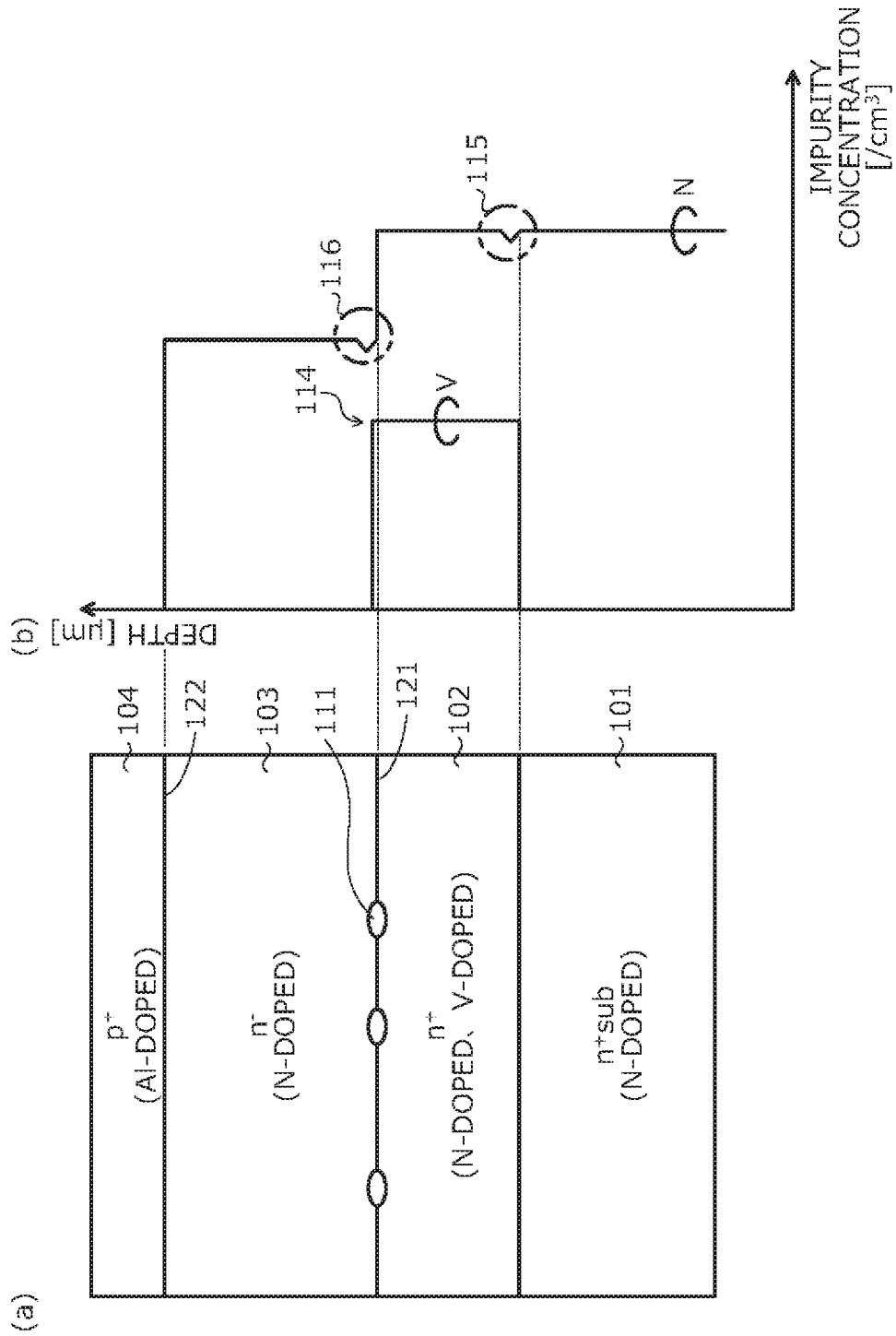
FIG. 5 is a diagram depicting problematic points of the conventional silicon carbide semiconductor device.

First, problems associated with the related techniques will be discussed. When epitaxial growth of an $n^+$-type buffer layer 102 and an $n^-$-type drift layer 103 is not performed successively to avoid auto-doping of the special element like in the conventional technique, after epitaxial growth of the $n^+$-type buffer layer 102, the epitaxial growth is suspended and substrate temperature is reduced, and thereafter epitaxial growth of the $n^-$-type drift layer 103 is resumed (refer to FIGS. 4 and 5). As a result, the following problems arise. FIGS. 4 and 5 are diagrams depicting problematic points of a conventional silicon carbide semiconductor device. Reference character (b) in FIG. 4 and reference character (a) in FIG. 5 indicate an example of a pin diode.

Curve (a) in FIG. 4, indicates hole density distribution during bipolar operation of a conventional pin diode. In FIG. 4, depth toward an $n^+$-type starting substrate 101 from an interface 122 (refer to FIG. 5) between the $n^-$-type drift layer 103 and a $p^+$-type anode layer 104 is indicated along a horizontal axis, while hole density during bipolar operation is indicated along a vertical axis. A cross-sectional view corresponding to curve (a) is indicated by reference character (b) in FIG. 4. "Depths" indicated on curve (a) along the horizontal axis in FIG. 4 correspond to depth positions of the $n^-$-type drift layer 103, the $n^+$-type buffer layer 102, and the $n^+$-type starting substrate 101 relative to the interface 122 between the $n^-$-type drift layer 103 and the $p^+$-type anode layer 104 as indicated by reference character (b) in FIG. 4.

In FIG. 5, a cross-sectional view of the conventional pin diode is indicated by reference character (a) while impurity concentration distribution of nitrogen (N) and vanadium in the conventional pin diode is indicated by curve (b). In FIG. 5, the depth toward the $n^+$-type buffer layer 102 from the interface 122 between the $n^-$-type drift layer 103 and the $p^+$-type anode layer 104 is indicated along a vertical axis. "Depths" indicated on curve (b) along the vertical axis in FIG. 5 correspond to depth positions of the $n^-$-type drift layer 103, the $n^+$-type buffer layer 102, and the $n^+$-type starting substrate 101 relative to the interface 122 between the $n^-$-type drift layer 103 and the $p^+$-type anode layer 104 as indicated by reference character (a) in FIG. 5. Impurity concentrations of nitrogen and vanadium at the depth positions are indicated by curve (b) along a vertical axis in FIG. 5.

For example, when breakdown voltage of the conventional pin diode is 1200V, dimensions and impurity concentrations of each region have the following values. The $n^+$-type buffer layer 102, the $n^-$-type drift layer 103, and the $p^+$-type anode layer 104 are silicon carbide layers sequentially formed on the $n^+$-type starting substrate 101 by epitaxial growth. Nitrogen concentration and a thickness of the $n^+$-type starting substrate 101 are $5\times10^{18}/cm^3$ and 350 μm, respectively. Nitrogen concentration in the $n^+$-type buffer layer 102 is $5\times10^{18}/cm^3$. Vanadium concentration in the $n^+$-type buffer layer 102 is $3\times10^{15}/cm^3$ and is substantially uniform in a depth direction.

Nitrogen concentration and a thickness of the $n^-$-type drift layer 103 are $1\times10^{16}/cm^3$ and 10 μm, respectively. Aluminum (Al) concentration and a thickness of the $p^+$-type anode layer 104 are $2\times10^{20}/cm^3$ and 0.3 μm, respectively. In the $n^+$-type buffer layer 102, near an interface with the $n^+$-type starting substrate 101, an impurity concentration variation 115 occurs in an initial stage of epitaxial growth. In the $n^-$-type drift layer 103, near an interface 121 with the $n^+$-type buffer layer 102, an impurity concentration variation 116 occurs in an initial stage of epitaxial growth.

As indicated by curve (a) in FIG. 4, in a conventional structure, while the hole density during bipolar operation is high in the $n^-$-type drift layer 103, due to band offset (or energy level difference) resulting from a difference of Fermi levels of the $n^-$-type drift layer 103 and the $n^+$-type buffer layer 102, the hole density in the $n^+$-type buffer layer 102 during bipolar operation is lower than that in the $n^-$-type drift layer 103. Furthermore, the hole density during bipolar operation further decreases due to recombination in the $n^+$-type buffer layer 102 and as a result, stacking faults do not expand from basal plane dislocations of the $n^+$-type starting substrate to inside the $n^-$-type drift layer.

Nonetheless, when epitaxial growth of the $n^+$-type buffer layer 102 and the $n^-$-type drift layer 103 is not performed successively to avoid auto-doping of vanadium, as indicated in FIG. 4, a crystal defect 111 caused by a particle or the like may be formed at the interface 121 between the $n^+$-type buffer layer 102 and the $n^-$-type drift layer 103. The crystal defect 111 may include a basal plane dislocation and when the crystal defect 111 includes a basal plane dislocation, a stacking fault originating at the crystal defect 111 expands toward the $n^-$-type drift layer.

A stacking fault originating at the crystal defect 111 tends to expand due to the high hole density in the $n^-$-type drift layer 103 as described above, and is detectable by a low-current screening test (or electrical current test). However, when the special element (herein, vanadium) is doped at a high concentration near a surface where the $n^-$-type drift layer 103 is to be formed by epitaxial growth, in an initial stage of the epitaxial growth for the $n^-$-type drift layer 103, unintended auto-doping of vanadium occurs at a high concentration in the $n^-$-type drift layer 103. Therefore, in the $n^-$-type drift layer 103, near the interface 121 with the $n^+$-type buffer layer 102, a layer (hereinafter, auto-doped layer) 112 auto-doped with a high concentration of vanadium is formed, a periphery of the crystal defect 111 becoming the auto-doped layer 112.

In this manner, when the auto-doped layer 112 is formed, in the periphery of the crystal defect 111 generated at the interface 121 between the $n^+$-type buffer layer 102 and the $n^-$-type drift layer 103, the vanadium concentration is increased by the auto-doped layer 112 (part indicated by reference numeral 114 in FIG. 5). In the auto-doped layer 112, the minority carrier lifetime is shorter, whereby the hole density during bipolar operation is low (part indicated by reference numeral 113 on curve (a) in FIG. 4) and expansion of a stacking fault from the crystal defect 111 is more difficult. Therefore, detection of a stacking fault originating at the crystal defect 111 is difficult by a screening test using a small current, and a defective product may be shipped as a product. To exclude defective products, a screening test using a large current has to be performed, whereby cost increases.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
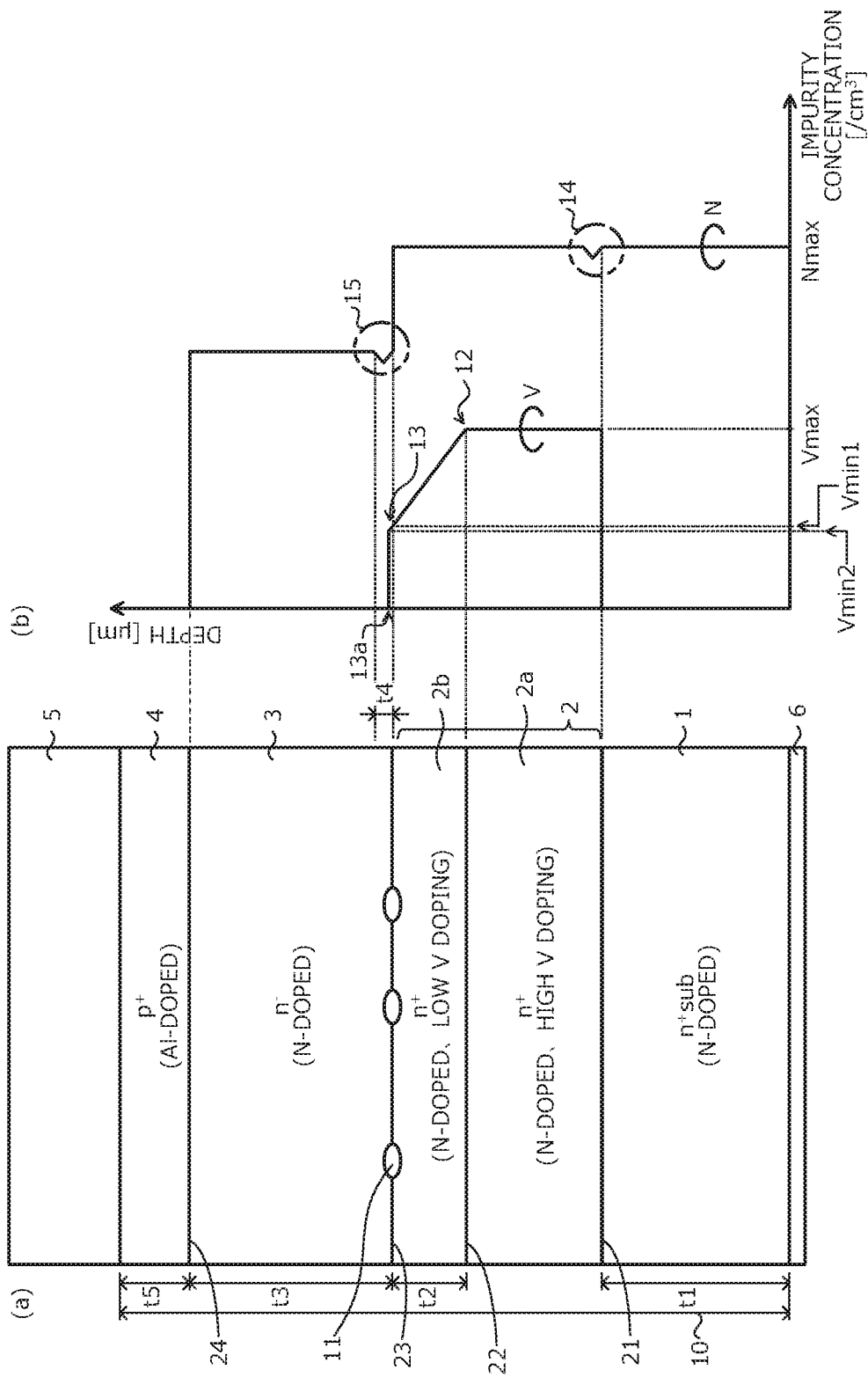
FIG. 1 is a cross-sectional view of a structure of a silicon carbide semiconductor device according to a first embodiment.

A structure of the silicon carbide (SiC) semiconductor device according to a first embodiment will be described taking a 1200V pin diode as an example. FIG. 1 is a cross-sectional view of the structure of the silicon carbide semiconductor device according to the first embodiment. In FIG. 1, a cross-sectional view of the silicon carbide semiconductor device according to the first embodiment is indicated by reference character (a), while impurity concentration distributions of nitrogen (N) and vanadium (V) in the silicon carbide semiconductor device according to the first embodiment are indicated by curve (b) in FIG. 1.

In FIG. 1, depth toward an $n^+$-type starting substrate 1 from an interface 24 between an $n^-$-type drift layer (or second first-conductivity-type epitaxial layer) 3 and a $p^+$-type anode layer (or second-conductivity-type layer) 4 is indicated along a vertical axis. The "depths" indicated on curve (b) along the vertical axis in FIG. 1 correspond to depth positions of the $n^-$-type drift layer 3, an $n^+$-type buffer layer 2, and the $n^+$-type starting substrate 1 relative to the interface 24 of the $n^-$-type drift layer 3 and the $p^+$-type anode layer 4 as indicated by reference character (a) in FIG. 1. Impurity concentrations of nitrogen and vanadium are indicated by curve (b) along a horizontal axis in FIG. 1.

The silicon carbide semiconductor device according to the first embodiment depicted in FIG. 1 is a pin diode in which silicon carbide layers respectively constituting the $n^+$-type buffer layer (or first first-conductivity-type epitaxial layer) 2, the $n^-$-type drift layer 3, and the $p^+$-type anode layer 4 are sequentially formed by epitaxial growth on a front surface of the $n^+$-type starting substrate 1 that contains silicon carbide. An anode electrode 5 and a cathode electrode 6 are electrically connected to the $p^+$-type anode layer 4 and a rear surface of the $n^+$-type starting substrate 1 (or $n^+$-type cathode layer), respectively.

Figure 3:
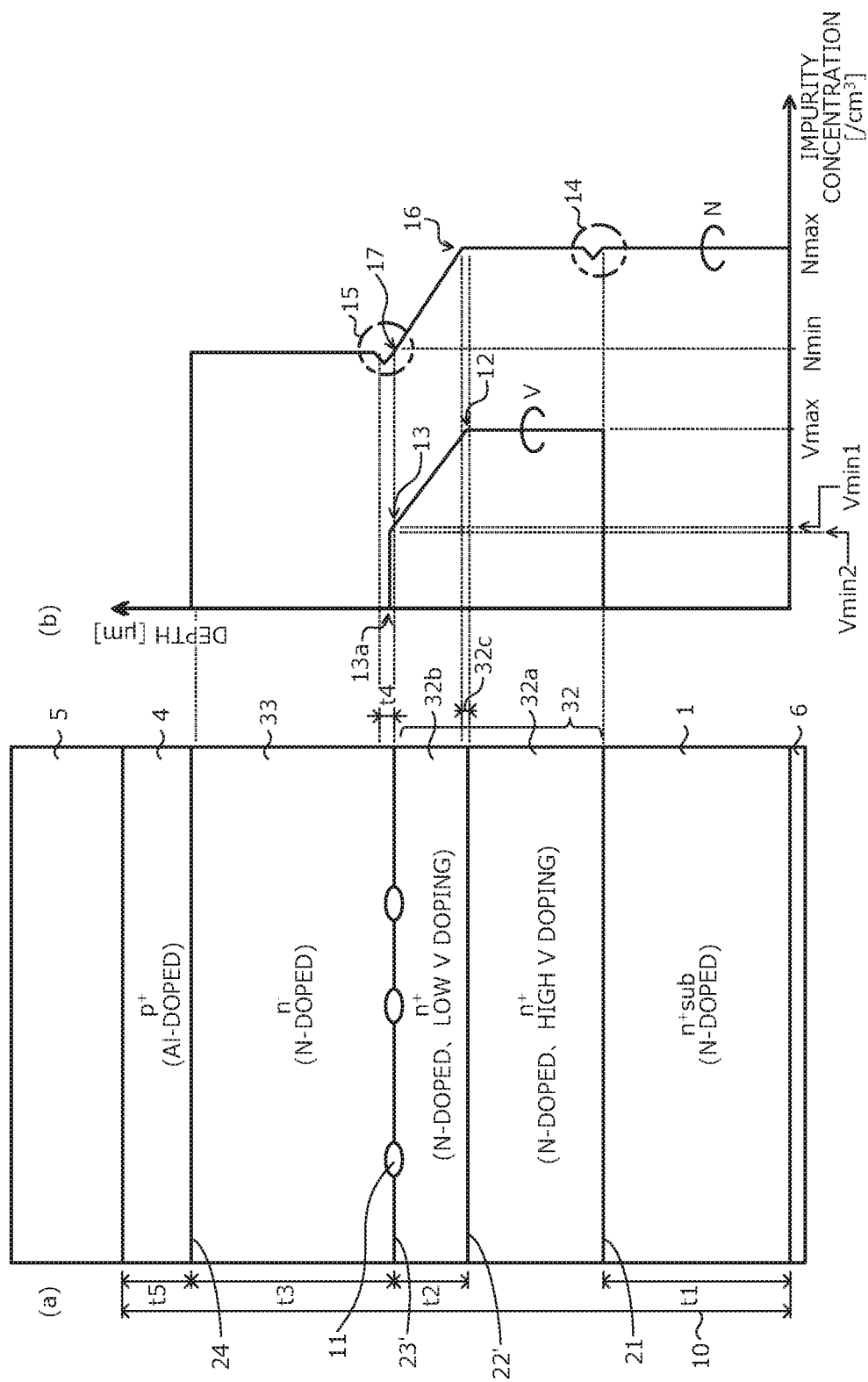
FIG. 3 is a cross-sectional view of a structure of the silicon carbide semiconductor device according to a second embodiment.

For example, nitrogen (N) is introduced into the $n^+$-type starting substrate 1 as an n-type dopant. An n-type impurity concentration (or nitrogen concentration) and a thickness t1 of the $n^+$-type starting substrate 1, for example, may be about $5.0 \times 10^{18}/cm^3$ and about 350 μm, respectively. In FIG. 1 and FIG. 3, introduction of nitrogen as a dopant is indicated as "N doped".

The $n^+$-type buffer layer 2 is formed by adding, so-called co-doping, a main element (e.g., nitrogen: first element) that is an n-type dopant and a special element (or second element) such as boron (B), titanium (Ti), iron (Fe), chromium (Cr), or vanadium (V), etc. that forms recombination centers. Here, a case where vanadium is added to the $n^+$-type buffer layer 2 will be described as an example.

An n-type impurity concentration in the $n^+$-type buffer layer 2 is higher than an n-type impurity concentration in the $n^-$-type drift layer 3 and is substantially uniform in the depth direction. The n-type impurity concentration in the $n^+$-type buffer layer 2, for example, may be substantially equal to the n-type impurity concentration in the $n^+$-type starting substrate 1. A maximum value Nmax of the n-type impurity concentration in the $n^+$-type buffer layer 2 (or nitrogen concentration), for example, is $1.0 \times 10^{18}/cm^3$ or more and less than $1.0 \times 10^{19}/cm^3$, and particularly, for example, may be $5.0 \times 10^{18}/cm^3$.

The depth direction is a direction from a front surface of an epitaxial substrate 10 toward a rear surface. The epitaxial substrate 10 is a semiconductor substrate in which silicon carbide layers constituting the $n^+$-type buffer layer 2, the $n^-$-type drift layer 3, and the $p^+$-type anode layer 4 are sequentially formed by epitaxial growth on the front surface of the $n^+$-type starting substrate 1. The front surface and the rear surface of the epitaxial substrate 10 are respectively a surface on a side of the epitaxial substrate 10 having the $p^+$-type anode layer 4 and a surface on a side of the epitaxial substrate 10 having the $n^+$-type starting substrate 1 (or the rear surface of the $n^+$-type starting substrate 1).

The n-type impurity concentration in the $n^+$-type buffer layer 2 near an interface 21 with the $n^+$-type starting substrate 1 is an impurity concentration that relative to an average n-type impurity concentration in the $n^+$-type buffer layer 2, increases in a convex shape or decreases in a concave shape due to an impurity concentration variation 14 described hereinafter in an initial stage of epitaxial growth. In FIG. 1, while curve (b) depicts a case in which the n-type impurity concentration variation 14 of the $n^+$-type buffer layer 2, near the interface 21 with the $n^+$-type starting substrate 1, is lower than the average impurity concentration in the $n^+$-type buffer layer 2, the n-type impurity concentration variation 14 may be higher than the average impurity concentration in the $n^+$-type buffer layer 2.

A vanadium concentration in the $n^+$-type buffer layer 2 is lower in a part (hereinafter, second part) 2b of the $n^+$-type buffer layer 2 on a side having an interface 23 with the $n^-$-type drift layer 3 than in a part (hereinafter, first part) 2a of the $n^+$-type buffer layer 2 on a side having the interface 21 with the $n^+$-type starting substrate 1. In FIG. 1 and FIG. 3, the first and the second parts 2a, 2b of the $n^+$-type buffer layer 2 respectively containing relatively high and relatively low concentrations of vanadium are indicated as "high V doping" and "low V doping".

The $n^+$-type buffer layer 2 contains vanadium and thus, has a function of suppressing hole injection from the $n^-$-type drift layer 3 side to the $n^+$-type starting substrate 1 during bipolar operation of the pin diode. Therefore, in the $n^+$-type buffer layer 2, the minority carrier (or hole) lifetime is shortened. The vanadium concentration in the first part 2a of the $n^+$-type buffer layer 2 is a maximum value Vmax of the vanadium concentration in the $n^+$-type buffer layer 2; for example, is $1.0 \times 10^{14}/cm^3$ or more and less than $5.0 \times 10^{18}/cm^3$; and is below the maximum value Nmax of the n-type impurity concentration in the $n^+$-type buffer layer 2. In particular, for example, the vanadium concentration in the first part 2a may be about $3.0 \times 10^{15}/cm^3$. The vanadium concentration in the first part 2a of the $n^+$-type buffer layer 2, for example, is uniform in the depth direction. The maximum value Vmax of the vanadium concentration in the $n^+$-type buffer layer 2 is at most the n-type impurity concentration in the $n^+$-type buffer layer 2. Setting the vanadium concentration in the first part 2a of the $n^+$-type buffer layer 2 in this manner enables a sufficient recombination promoting effect to be obtained in the $n^+$-type buffer layer 2. The first part 2a of the $n^+$-type buffer layer 2 is a part having a substantial recombination promoting effect in the $n^+$-type buffer layer 2. A thickness of the first part 2a of the $n^+$-type buffer layer 2, for example, may be in a range from about 0.1 μm to 5 μm.

An average vanadium concentration in the second part 2b of the $n^+$-type buffer layer 2 is lower than an average vanadium concentration in the first part 2a of the $n^+$-type buffer layer 2. In particular, the vanadium concentration in the second part 2b of the $n^+$-type buffer layer 2, for example, decreases linearly at a predetermined rate (as illustrated in FIG. 1 by the slope of the line between points 12 and 13) from an interface 22 between the first part 2a and the second part 2b of the n$^+$-type buffer layer 2, toward the interface 23 between the n$^+$-type buffer layer 2 and the n$^-$-type drift layer 3.

In this case, the vanadium concentration in the second part 2b of the n$^+$-type buffer layer 2 exhibits a maximum value at the interface 22 between the first part 2a and the second part 2b of the n$^+$-type buffer layer 2 (part indicated by reference 12). The maximum value of the vanadium concentration in the second part 2b of the n$^+$-type buffer layer 2 is the maximum value Vmax of the vanadium concentration in the n$^+$-type buffer layer 2. Additionally, the vanadium concentration in the second part 2b of the n$^+$-type buffer layer 2 exhibits a minimum value Vmin1 at the interface 23 between the n$^+$-type buffer layer 2 and the n$^-$-type drift layer 3 (part indicated by reference numeral 13).

The vanadium concentration in the second part 2b of the n$^+$-type buffer layer 2, at the interface 23 between the n$^+$-type buffer layer 2 and the n$^-$-type drift layer 3, suffices to be lower than the maximum value Vmax of the vanadium concentration in the n$^+$-type buffer layer 2 and may be uniform in the depth direction. The vanadium concentration in the second part 2b of the n$^+$-type buffer layer 2, at the interface 23 between the n$^+$-type buffer layer 2 and the n$^-$-type drift layer 3, for example, may be about one tenth of the maximum value Vmax of the vanadium concentration in the n$^+$-type buffer layer 2 or less.

The second part 2b of the n$^+$-type buffer layer 2 has a function of suppressing auto-doping of vanadium from the n$^+$-type buffer layer 2 to the n$^-$-type drift layer 3 during epitaxial growth of the n$^-$-type drift layer 3. Therefore, auto-doping of vanadium at a high concentration may be prevented in the n$^-$-type drift layer 3, at the interface 23 with the n$^+$-type buffer layer 2. A thickness t2 of the second part 2b of the n$^+$-type buffer layer 2 is in a range from about 0.1 µm to 10 µm.

A reason for setting the thickness t2 of the second part 2b of the n$^+$-type buffer layer 2 to 0.1 µm or more is that when the thickness t2 of the second part 2b of the n$^+$-type buffer layer 2 too thin, as described hereinafter, in an initial stage of epitaxial growth for forming the n$^-$-type drift layer 3, the second part 2b of the n$^+$-type buffer layer 2 is etched and removed by hydrogen (H$_2$) gas in the epitaxial growth furnace, and as a result, the described effect of the second part 2b of the n$^+$-type buffer layer 2 is not obtained. A reason for setting the thickness t2 of the second part 2b of the n$^+$-type buffer layer 2 to about 10 µm or less is that the greater the thickness t2 of the second part 2b of the n$^+$-type buffer layer 2 is, the higher resistance of the pin diode becomes. The thickness t2 of the second part 2b of the n$^+$-type buffer layer 2 may be about 5 µm or less.

For example, nitrogen (N) is introduced into the n$^-$-type drift layer 3 as a dopant. The n-type impurity concentration (or nitrogen concentration) and a thickness t3 of the n$^-$-type drift layer 3, for example, may be about $1.0 \times 10^{16}/\text{cm}^3$ and about 10 µm, respectively. At the interface 23 between the n$^+$-type buffer layer 2 and the n$^-$-type drift layer 3, crystal defects 11 caused by particles during epitaxial growth of the n$^-$-type drift layer 3 may be formed. Further, in the n$^-$-type drift layer 3, near the interface 23 with the n$^+$-type buffer layer 2, vanadium is auto-doped at a minimum value Vmin2 that is lower than the minimum value Vmin1 of the vanadium concentration in the n$^+$-type buffer layer 2 (part indicated by reference character 13a).

In other words, in the epitaxial substrate 10, vanadium is doped from the interface 21 between the n$^+$-type starting substrate 1 and the n$^+$-type buffer layer 2, to inside the n$^-$-type drift layer 3, near the interface 23 with the n$^+$-type buffer layer 2. Distribution of the vanadium concentration in the epitaxial substrate 10 exhibits the maximum value Vmax in the first part 2a of the n$^+$-type buffer layer 2, with the vanadium concentration decreasing linearly at a rate (illustrated by the slope of the line between points 12 and 13 in FIG. 1) toward the n$^-$-type drift layer 3 from the interface 22 between the first part 2a and the second part 2b of the n$^+$-type buffer layer 2, and exhibiting the minimum value Vmin2 near the interface 23 of the n$^-$-type drift layer 3 with the n$^+$-type buffer layer 2.

The n-type impurity concentration in the n$^-$-type drift layer 3, near the interface 23 with the n$^+$-type buffer layer 2, is an impurity concentration that differs from an average impurity concentration in the n$^-$-type drift layer 3 due to an n-type impurity concentration variation 15 in an initial stage of resumption of the epitaxial growth described hereinafter. In particular, the n-type impurity concentration variation 15 in the n$^-$-type drift layer 3, near the interface 23 with the n$^+$-type buffer layer 2, for example, occurs within a range t4 of about 3 µm from the interface 23 between the n$^+$-type buffer layer 2 and the n$^-$-type drift layer 3 and this variation value is ±10% of the average impurity concentration in the n$^-$-type drift layer 3 or more. In FIG. 1, curve (b) depicts a case in which the n-type impurity concentration variation 15 in the n$^-$-type drift layer 3, near the interface 23 with the n$^+$-type buffer layer 2, is lower than the average impurity concentration in the n$^-$-type drift layer 3.

At a pn junction formed by the interface 24 between the n$^-$-type drift layer 3 and the p$^+$-type anode layer 4, the pin diode is configured. For example, aluminum (Al) is introduced as a dopant into the p$^+$-type anode layer 4. A p-type impurity concentration (or aluminum concentration) and a thickness t5 of the p$^+$-type anode layer 4, for example, may be about $2 \times 10^{20}/\text{cm}^3$ and about 0.3 µm, respectively. The p$^+$-type anode layer 4 may be a region formed by ion implantation of a p-type impurity into a surface layer of the n$^-$-type drift layer 3.

Figure 2:
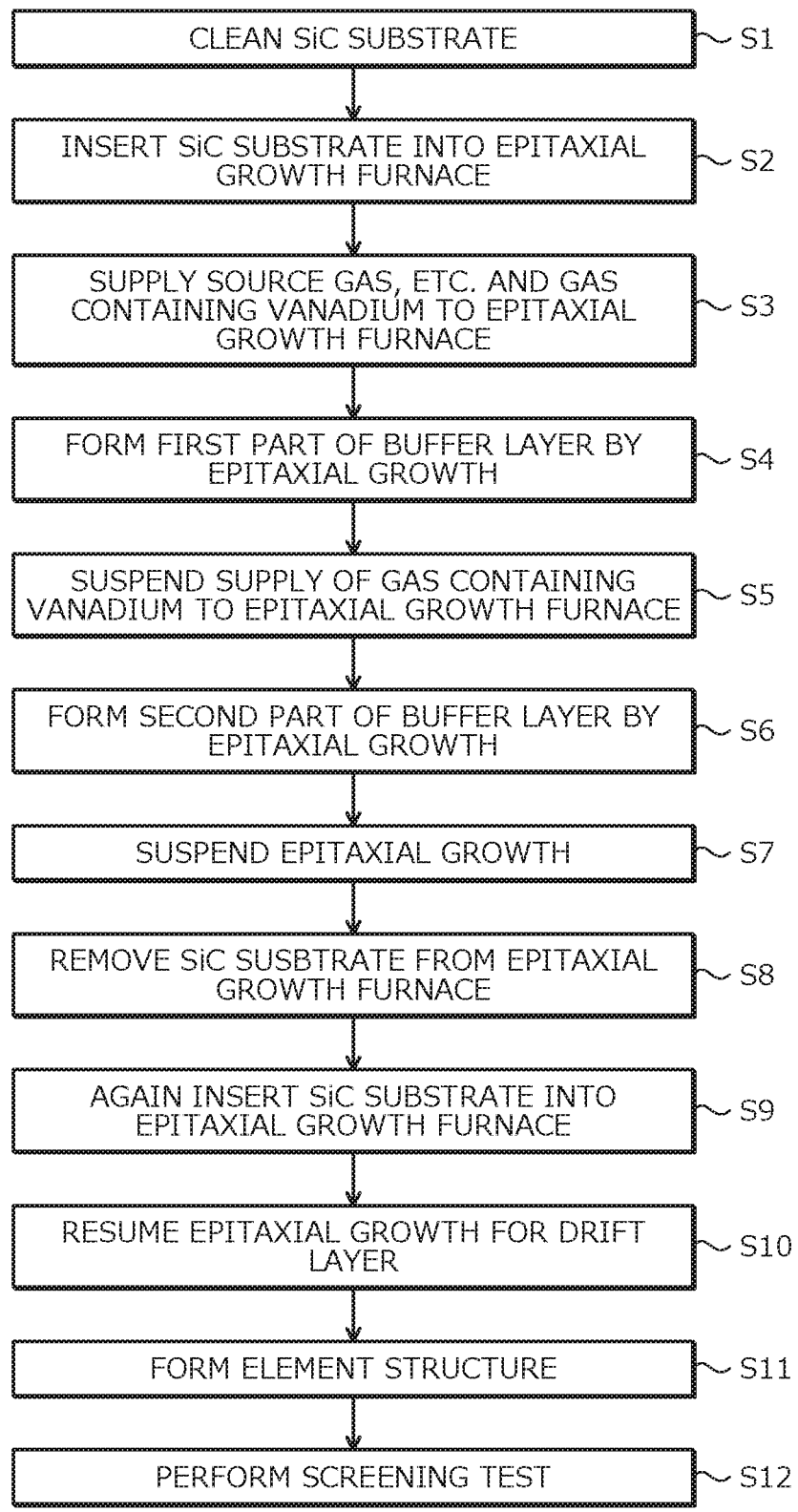
FIG. 2 is a flowchart of an outline of a method of manufacturing a silicon carbide semiconductor device according to the first embodiment.

A method of manufacturing a silicon carbide semiconductor device according to the first embodiment will be described. FIG. 2 is a flowchart of an outline of the method of manufacturing a silicon carbide semiconductor device according to the first embodiment. First, the n$^+$-type starting substrate 1 containing silicon carbide is prepared, and the n$^+$-type starting substrate 1 is washed by a general cleaning method like organic cleaning method or RCA cleaning method for a semiconductor substrate (step S1).

Next, the n$^+$-type starting substrate 1 is inserted in the epitaxial growth furnace (not depicted) (step S2). The epitaxial growth furnace, for example, may be a thermal chemical vapor deposition (CVD) furnace. Further, a carrier gas is supplied inside the furnace and the temperature inside the epitaxial growth furnace is adjusted so that a substrate temperature of the n$^+$-type starting substrate 1 becomes a predetermined temperature suitable for epitaxial growth. For example, hydrogen (H$_2$) gas may be used as the carrier gas.

Next, a source gas, a doping gas, and an additive gas as well as a gas containing the described special element (here, vanadium) are supplied inside the epitaxial growth furnace, in addition to the carrier gas (step S3). In the process at step S3, as a source gas, a gas containing silicon (Si) and a gas containing carbon (C) are concurrently introduced. The gas containing silicon, for example, may be a monosilane (SiH$_4$) gas. The gas containing carbon, for example, may be a propane (C$_3$H$_8$) gas.

As a doping gas, for example, a gas containing nitrogen (N$_2$) is used. The gas containing nitrogen, for example, may be nitrogen gas. As an additive gas, a gas containing chlorine (Cl) may be suitably added. The gas containing chlorine, for example, may be hydrogen chloride (HCl) gas. As a gas containing vanadium, for example, tetrachloride vanadium (VCl$_4$) gas may be used.

Next, in a mixed gas atmosphere constituted by the source gas, the carrier gas, the doping gas, the additive gas, and the gas containing vanadium supplied in the process at step S3, for example, the first part 2a of the n$^+$-type buffer layer 2 is formed by epitaxial growth on the front surface of the n$^+$-type starting substrate 1 by a CVD method (step S4). In the process at step S4, other than the main element (or nitrogen) that is an n-type dopant, vanadium that forms recombination centers is added, so-called co-doping, whereby the first part 2a of the n$^+$-type buffer layer 2 is formed.

In general, in the initial stage of epitaxial growth, epitaxial growth conditions are not stable and therefore, the impurity concentration in the epitaxial layer varies. As a result, in the initial stage of epitaxial growth of the n$^+$-type buffer layer 2, the n-type impurity concentration (or nitrogen concentration) variation 14 of the n$^+$-type buffer layer 2 occurs. Therefore, the n-type impurity concentration in the n$^+$-type buffer layer 2, near the interface 21 with the n$^+$-type starting substrate 1, is an impurity concentration that differs from the average impurity concentration in the n$^+$-type buffer layer 2.

Next, supply of the gas containing vanadium into the epitaxial growth furnace is suspended (step S5). Next, in the mixed gas atmosphere constituted by the source gas, the carrier gas, the doping gas, and the additive gas supplied from the process at step S3, the second part 2b of the n$^+$-type buffer layer 2 is formed by epitaxial growth, for example, by a CVD method successively after the epitaxial growth of the first part 2a of the n$^+$-type buffer layer 2 (step S6).

In the mixed gas atmosphere used in the process at step S6, the gas containing vanadium and supplied inside the epitaxial growth furnace until completion of the process at step S4 remains in the epitaxial growth furnace. Therefore, even in the process at step S6, nitrogen, which is the n-type dopant, and the vanadium that remains in the epitaxial growth furnace are added, so-called co-doping, whereby the second part 2b of the n$^+$-type buffer layer 2 is formed.

In the process at step S6, the gas containing vanadium and remaining inside the epitaxial growth furnace is gradually exhausted outside the epitaxial growth furnace according to the epitaxial growth of the second part 2b of the n$^+$-type buffer layer 2. Therefore, the vanadium concentration in the second part 2b of the n$^+$-type buffer layer 2 decreases according to the epitaxial growth of the second part 2b of the n$^+$-type buffer layer 2, and is the minimum value Vmin1 at an uppermost surface (i.e., the interface 23 between the n$^+$-type buffer layer 2 and the n$^-$-type drift layer 3 formed at a subsequent step) of the n$^+$-type buffer layer 2.

Further, in the process at step S6, with the substrate temperature maintained from the process at step S4, the second part 2b of the n$^+$-type buffer layer 2 is formed by epitaxial growth in the epitaxial growth furnace used in the process at step S4, successively after the epitaxial growth of the first part 2a of the n$^+$-type buffer layer 2. Therefore, epitaxial growth conditions are stable and variation of the n-type impurity concentration (or nitrogen concentration) of the second part 2b of the n$^+$-type buffer layer 2 does not occur. By the processes at steps S4 to S6, the n$^+$-type buffer layer 2 is formed.

Next, the epitaxial growth is suspended (step S7), and the epitaxial substrate is removed from the epitaxial growth furnace (step S8). The epitaxial substrate at this point in time is a silicon carbide epitaxial substrate in which silicon carbide layers constituting the n$^+$-type buffer layer 2 are sequentially formed on the n$^+$-type starting substrate 1 by epitaxial growth. Next, the epitaxial substrate is again inserted into the epitaxial growth furnace (not depicted) (step S9).

In the process at step S9, the epitaxial growth furnace used for forming the n$^+$-type buffer layer 2 by epitaxial growth is reused after the epitaxial growth furnace is cleaned and the components, etc. are replaced, or a different epitaxial growth furnace is used. As a result, vanadium that has adhered to the components, etc. inside the epitaxial growth furnace during the epitaxial growth of the n$^+$-type buffer layer 2 may be prevented from being mixed (or auto-doped) into the n$^-$-type drift layer 3 at a subsequent step.

Next, the temperature inside the epitaxial growth furnace is adjusted so that the substrate temperature of the epitaxial substrate becomes a predetermined temperature suitable for epitaxial growth. Next, epitaxial growth is resumed, the n$^-$-type drift layer 3 is formed on the n$^+$-type buffer layer 2 (i.e., on the second part 2b of the n$^+$-type buffer layer 2) by epitaxial growth (step S10). Resumption of the epitaxial growth refers to again performing epitaxial growth on the epitaxial substrate whose substrate temperature has decreased in the processes at steps S7, S8.

As described, at step S6, vanadium concentration is lowered and the second part 2b of the n$^+$-type buffer layer is formed, whereby the vanadium concentration near a surface (on which the n$^-$-type drift layer 3 is formed by epitaxial growth) of the second part 2b of the n$^+$-type buffer layer becomes lower. As a result, in the process at step S10, during epitaxial growth of the n$^-$-type drift layer 3, auto-doping of vanadium into the n$^-$-type drift layer 3 at a high concentration may be suppressed.

Further, when epitaxial growth is resumed at step S10, the crystal defects 11 caused by particles or the like may be formed at the interface 23 between the n$^+$-type buffer layer 2 and the n$^-$-type drift layer 3. Even when a basal plane dislocation is included in the crystal defects 11, the vanadium concentration in the second part 2b of the n$^+$-type buffer layer is lower and therefore, stacking faults originating at the crystal defects 11 easily expand, enabling detection by a screening test (or electrical current test) using a low current.

Furthermore, even in an initial stage of resumption of epitaxial growth at step S10, epitaxial growth conditions are not stable. Therefore, in the initial stage of resumption of epitaxial growth of the n$^-$-type drift layer 3, the n-type impurity concentration (or nitrogen concentration) variation 15 of the n$^-$-type drift layer 3 occurs. As a result, the n-type impurity concentration in the n$^-$-type drift layer 3, near the interface 23 with the n$^+$-type buffer layer 2, is an impurity concentration that differs from the average impurity concentration in the n$^-$-type drift layer 3.

Next, a predetermined device structure is formed in the epitaxial substrate (step S11). In the process at step S11, the p$^+$-type anode layer 4 is formed on the n$^-$-type drift layer 3 by epitaxial growth. As a result, the epitaxial substrate 10 is formed in which silicon carbide layers constituting the n$^+$-type buffer layer 2, the n$^-$-type drift layer 3, and the p$^+$-type anode layer 4 are sequentially formed on the front surface of the n$^+$-type starting substrate 1 by epitaxial growth.

In place of forming the p$^+$-type anode layer 4 on the n$^-$-type drift layer 3 by epitaxial growth, the p$^+$-type anode layer 4 may be formed in the surface layer of the n$^-$-type drift layer 3 by ion implantation. In this case, the epitaxial substrate 10 is formed in which silicon carbide layers constituting the n$^+$-type buffer layer 2 and the n$^-$-type drift layer 3 are sequentially formed on the front surface of the n$^+$-type starting substrate 1 by epitaxial growth. Subsequently, the anode electrode 5 and the cathode electrode 6 are formed to be electrically connected to the p$^+$-type anode layer 4 and the rear surface of the n$^+$-type starting substrate 1 (or n$^+$-type cathode layer), respectively.

Thereafter, a screening test is performed with respect to the epitaxial substrate while in a state of an epitaxial wafer or a state of being cut (diced) into individual chips (step S12). The screening test is a test of applying voltage higher than an operating voltage of the product to eliminate products in which an initial failure has occurred. Thus, the pin diode depicted in FIG. 1 is completed.

The silicon carbide semiconductor device according to the first embodiment described, without limitation to a pin diode, is further applicable to a bipolar device having a pn junction in which current flows in the forward direction. In particular, for example, the silicon carbide semiconductor device is further applicable to a Schottky barrier diode (SBD), a parasitic pn junction diode (or body diode) formed by a pn junction between a base region and a drift region of an insulated gate bipolar transistor (IGBT), a MOSFET (Metal Oxide Semiconductor Field Effect Transistor: insulated-gate field effect transistor), etc. When the present invention is applied to these silicon carbide semiconductor devices, in the process at step S11 above, a corresponding general device structure is formed by a general method.

Further, in the silicon carbide semiconductor device according to the first embodiment described, the vanadium concentration in the second part 2b of the n$^+$-type buffer layer 2 may be lower than the vanadium concentration in the first part 2a of the n$^+$-type buffer layer 2 and a profile of the vanadium concentration in the second part 2b of the n$^+$-type buffer layer 2 may be uniform in the depth direction. Further, in place of the first and the second parts 2a, 2b of the n$^+$-type buffer layer 2, the n$^+$-type buffer layer 2 may be provided having a 2-layered structure in which silicon carbide layers having vanadium concentrations equal to those of the first and the second parts 2a, 2b are sequentially formed by epitaxial growth.

As described above, according to the first embodiment, a special element concentration in a part (or second part) of the n$^+$-type buffer layer disposed at a side of the interface with the n$^-$-type drift layer is lower than a maximum value of the special element concentration in the n$^+$-type buffer layer, whereby the special element concentration of the surface of the n$^+$-type buffer layer on which the n$^-$-type drift layer is formed by epitaxial growth may be reduced. As a result, during epitaxial growth of the n$^-$-type drift layer, the special element in the n$^+$-type buffer layer may be prevented from being auto-doped at a high concentration into the n$^-$-type drift layer. Therefore, when the n$^-$-type drift layer is formed by suspending epitaxial growth after the epitaxial growth of the n$^+$-type buffer layer and thereafter, resuming epitaxial growth, even when a crystal defect is formed at the interface between the n$^+$-type buffer layer and the n$^-$-type drift layer, the special element concentration in a periphery of the crystal defect may be lowered. As a result, shortening of the minority carrier lifetime in the periphery of the crystal defect may be suppressed and reduction of the hole density during bipolar operation may be suppressed. As a result, during bipolar operation, stacking faults originating at crystal defects formed at the interface between the n$^+$-type buffer layer and the n$^-$-type drift layer expand more easily than in the conventional structure (refer to reference character (a) in FIG. 5), enabling easy detection of the stacking faults in a short period of time by a screening test using low current. As a result, shipping of a defective product may be prevented, enabling product reliability to be enhanced. Further, since a screening test using a large current is unnecessary, increases in inspection costs may be prevented.

A structure of the silicon carbide semiconductor device according to a second embodiment will be described. FIG. 3 is a cross-sectional view of the structure of the silicon carbide semiconductor device according to the second embodiment. The silicon carbide semiconductor device according to the second embodiment differs from the silicon carbide semiconductor device according to the first embodiment in that near an interface 23' between the n$^+$-type buffer layer 32 and the n$^-$-type drift layer 33, an n-type impurity concentration (or nitrogen concentration) of a second part 32b of the n$^+$-type buffer layer 32 is set to be lower than the maximum value Nmax of the n-type impurity concentration in the n$^+$-type buffer layer 2.

In particular, an average n-type impurity concentration in the second part 32b of the n$^+$-type buffer layer 32 is lower than an average n-type impurity concentration in a first part 32a of the n$^+$-type buffer layer 32. In particular, the n-type impurity concentration in the second part 32b of the n$^+$-type buffer layer 32, for example, decreases linearly at a predetermined rate (illustrated by the slope of the line between points 12 and 13 in FIG. 3), from an interface 22' between the first part 32a and the second part 32b of the n$^+$-type buffer layer 32, disposed at a side of an interface 23' between the n$^+$-type buffer layer 32 and the n$^-$-type drift layer 33.

In this case, the n-type impurity concentration in the second part 32b of the n$^+$-type buffer layer 32 exhibits a maximum value (part indicated by reference numeral 16) near the interface 22' between the first part 32a of the n$^+$-type buffer layer 32 and the second part 32b. The maximum value of the n-type impurity concentration in the second part 32b of the n$^+$-type buffer layer 32 is the maximum value Vmax of the n-type impurity concentration in the n$^+$-type buffer layer 32. Additionally, the n-type impurity concentration in the second part 32b of the n$^+$-type buffer layer 32 exhibits a minimum value Nmin (part indicated by reference numeral 17) at the interface 23' between the n$^+$-type buffer layer 32 and the n$^-$-type drift layer 33.

The n-type impurity concentration in the second part 32b of the n$^+$-type buffer layer 32, at the interface 23' between the n$^+$-type buffer layer 32 and the n$^-$-type drift layer 33, may be lower than the maximum value Vmax of the n-type impurity concentration in the n$^+$-type buffer layer 32, and may be uniform in the depth direction. The n-type impurity concentration in the second part 32b of the n$^+$-type buffer layer 32, at the interface 23' between the n$^+$-type buffer layer 32 and the n$^-$-type drift layer 33, for example, may be about one tenth of the maximum value Nmax of the n-type impurity concentration in the n$^+$-type buffer layer 32 or less.

In the second embodiment, the n-type impurity concentration (or nitrogen concentration) in the n$^-$-type drift layer 33 is set to be about $1\times10^{15}$/cm$^3$ or less, thereby enabling high breakdown voltage. In particular, the n-type impurity concentration (or nitrogen concentration) and the thickness t3 of the n$^-$-type drift layer 33, for example, may be set to be about $3\times10^{14}$/cm$^3$ and about 150 μm, respectively, for a 13 kV pin diode. In this case, the n-type impurity concentration in the second part 32b of the n$^+$-type buffer layer 32 is reduced, whereby auto-doping of the n-type impurity (or nitrogen) from the n$^+$-type buffer layer 32 to the n$^-$-type drift layer 33 at a high concentration may be suppressed during epitaxial growth of the n$^-$-type drift layer 33.

The method of manufacturing a silicon carbide semiconductor device according to the second embodiment includes in the method of manufacturing a silicon carbide semiconductor device according to the first embodiment (refer to FIG. 2), suspending the supply of the gas containing vanadium into the epitaxial growth furnace during the process at step S5 and further suspending the supply of the doping gas. Further, during the process at step S6, the second part 32b of the n$^+$-type buffer layer 32 is formed using the residual doping gas and the residual gas containing vanadium in the epitaxial growth furnace.

The supply of the doping gas may be suspended in the midst of the process at step S4. In this case, in the midst of the epitaxial growth of the first part 32a of the n$^+$-type buffer layer 32, the supply of the doping gas is suspended. Therefore, the n-type impurity concentration in a part of the first part 32a of the n$^+$-type buffer layer 32 disposed at a side of the interface 22 with the second part 32b becomes lower than the maximum value Nmax of the n-type impurity concentration in the n$^+$-type buffer layer 2. The maximum value of the n-type impurity concentration in the second part 32b of the n$^+$-type buffer layer 32 becomes lower than the maximum value Nmax of the n-type impurity concentration in the n$^+$-type buffer layer 2.

Further, the supply of the doping gas may be suspended in the midst of the process at step S6. In this case, in the midst of the epitaxial growth of the second part 32b of the n$^+$-type buffer layer 32, the supply of the doping gas is suspended. Therefore, the n-type impurity concentration in a part 32c of the second part 32b of the n$^+$-type buffer layer 32 toward the interface 22' with the first part 32a becomes the maximum value Nmax of the n-type impurity concentration in the n$^+$-type buffer layer 2. In FIG. 3, curve (b) represents a case in which the n-type impurity concentration in the part 32c of the second part 32b of the n$^+$-type buffer layer 32 disposed at a side of the interface 22' with the first part 32a is the maximum value Nmax of the n-type impurity concentration in the n$^+$-type buffer layer 2.

As described, according to the second embodiment, effects similar to those of the first embodiment may be obtained. Further, according to the second embodiment, the n-type impurity concentration in the second part of the n$^+$-type buffer layer is made lower than the n-type impurity concentration in the first part of the n$^+$-type buffer layer, whereby the n-type impurity concentration in the n$^+$-type buffer layer, at the surface of the n$^+$-type buffer layer where the n$^-$-type drift layer is to be formed by epitaxial growth, may be reduced. As a result, during epitaxial growth of the n$^-$-type drift layer, auto-doping of the n-type impurity in the n$^+$-type buffer layer into the n$^-$-type drift layer at a high concentration may be suppressed. As a result, even when the n-type impurity concentration in the n$^-$-type drift layer is reduced to achieve a high breakdown voltage, the n-type impurity concentration in the n$^-$-type drift layer may be suppressed from becoming higher than a design value.

The present invention, without limitation to the described embodiments, may be variously modified within a range not departing from the spirit of the invention. For example, in the described embodiments, dimensions and impurity concentrations of regions are variously set according to required specifications. Further, the present invention is similarly implemented when the conductivity types (n-type, p-type) are reversed.

According to the embodiments of the present invention, even when a crystal defect is formed at the interface between the first first-conductivity-type epitaxial layer and second first-conductivity-type epitaxial layer, a second element concentration in a periphery of the crystal defect may be reduced. As a result, shortening of the minority carrier lifetime in the periphery of the crystal defect may be prevented, enabling decreases in the hole density during bipolar operation to be suppressed. Therefore, during bipolar operation, a stacking fault originating from the crystal defect formed at the interface between the first first-conductivity-type epitaxial layer and second first-conductivity-type epitaxial layer easily expands, enabling the stacking fault to be easily detected in a short period by a screening test using a low current. As a result, a defective product may be prevented from being shipped as a product. Further, a screening test using a large current is unnecessary, enabling increases in inspection costs to be prevented.

The silicon carbide semiconductor device and the method of manufacturing a silicon carbide semiconductor device according to the embodiments of the present invention achieve an effect in that product reliability may be enhanced at a low cost.

As described, the silicon carbide semiconductor device and the method of manufacturing a silicon carbide semiconductor device according to the embodiments of the present invention are useful for bipolar devices such as pin diodes, MOSFETs, IGBTs, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having a pn junction through which current flows in a forward direction, the silicon carbide semiconductor device comprising:
   a semiconductor substrate, being of a first conductivity type and containing silicon carbide;
   a first first-conductivity-type epitaxial layer, being of the first conductivity type and containing silicon carbide, the first first-conductivity-type epitaxial layer provided on one main surface of the semiconductor substrate;
   a second first-conductivity-type epitaxial layer, being of the first conductivity type and containing silicon carbide, the second first-conductivity-type epitaxial layer provided at a surface of the first first-conductivity-type epitaxial layer on a first side of the first first-conductivity-type epitaxial layer, opposite a second side of the first first-conductivity-type epitaxial layer that faces toward the semiconductor substrate, a first-conductivity-type impurity concentration in the second first-conductivity-type epitaxial layer being lower than a first-conductivity-type impurity concentration in the first first-conductivity-type epitaxial layer; and
   a second-conductivity-type layer being of a second conductivity type, and containing silicon carbide, the second-conductivity-type layer provided on a first side of the second first-conductivity-type epitaxial layer, opposite a second side of the second first-conductivity-type epitaxial layer that faces toward the semiconductor substrate, the second-conductivity-type layer being in contact with the second first-conductivity-type epitaxial layer and forming the pn junction, wherein
   the first first-conductivity-type epitaxial layer contains, as impurities, a first element that is a first-conductivity-type dopant and a second element that forms a recombination center, a maximum concentration of the first element in the first first-conductivity-type epitaxial layer is at least $1.0\times10^{18}/cm^3$ and less than $1.0\times10^{19}/cm^3$, a maximum concentration of the second element in the first first-conductivity-type epitaxial layer is at least $1.0\times10^{14}/cm^3$ and less than $5.0\times10^{18}/cm^3$, and is below the maximum concentration of the first element in the first first-conductivity-type epitaxial layer, and the first first-conductivity-type epitaxial layer includes a first part disposed at a side of an interface of the first first-conductivity-type epitaxial layer with the semiconductor substrate, and a second part disposed at a side of an interface of the first first-conductivity-type epitaxial layer with the second first-conductivity-type epitaxial layer, a concentration of the second element in the second part being lower than a concentration of the second element in the first part, a thickness of the first part being in a range from 0.1 μm to 5 μm.

2. The silicon carbide semiconductor device according to claim 1, wherein the concentration of the second element in the first first-conductivity-type epitaxial layer, at the interface with the second first-conductivity-type epitaxial layer, is at most one tenth of the maximum concentration of the second element in the first first-conductivity-type epitaxial layer.

3. The silicon carbide semiconductor device according to claim 1, wherein the concentration of the second element in the second part of the first first-conductivity-type epitaxial layer decreases from the first part of the first first-conductivity-type epitaxial layer toward the second first-conductivity-type epitaxial layer.

4. The silicon carbide semiconductor device according to claim 1, wherein a concentration of the first element in the first first-conductivity-type epitaxial layer, at the interface with the second first-conductivity-type epitaxial layer, is at most one tenth of the maximum concentration of the first element in the first first-conductivity-type epitaxial layer.

5. The silicon carbide semiconductor device according to claim 1, wherein the second element is any one of boron, titanium, iron, chromium, and vanadium.

6. The silicon carbide semiconductor device according to claim 1, wherein impurity concentration variation in the second first-conductivity-type epitaxial layer occurs near the interface of the second first-conductivity-type epitaxial layer with the first first-conductivity-type epitaxial layer.

7. The silicon carbide semiconductor device according to claim 6, wherein the impurity concentration variation in the second first-conductivity-type epitaxial layer is at least ±10% of an average value of the first-conductivity-type impurity concentration in the second first-conductivity-type epitaxial layer.

8. The silicon carbide semiconductor device according to claim 6, wherein the impurity concentration variation in the second first-conductivity-type epitaxial layer is in a range within 3 μm from the interface of the second first-conductivity-type epitaxial layer with the first first-conductivity-type epitaxial layer.

9. A method of manufacturing a silicon carbide semiconductor device having a pn junction through which current flows in a forward direction, the method comprising:

forming by epitaxial growth on one main surface of a semiconductor substrate of a first conductivity type, containing silicon carbide, a first first-conductivity-type epitaxial layer containing, as impurities, a first element that is a first-conductivity-type dopant and a second element that forms a recombination center, a maximum concentration of the first element being at least $1.0\times10^{18}/cm^3$ and less than $1.0\times10^{19}/cm^3$, a maximum concentration of the second element being at least $1.0\times10^{14}/cm^3$ and less than $5.0\times10^{18}/cm^3$ and at most the maximum concentration of the first element;

forming a second first-conductivity-type epitaxial layer by epitaxial growth on a surface of the first first-conductivity-type epitaxial layer, with an impurity concentration lower than an impurity concentration in the first first-conductivity-type epitaxial layer; and forming a second-conductivity-type layer in a surface layer or on a surface of the second first-conductivity-type epitaxial layer, and forming the pn junction between the second-conductivity-type layer and the second first-conductivity-type epitaxial layer, wherein forming the first first-conductivity-type epitaxial layer includes:

forming a first part disposed at a side of an interface of the first first-conductivity-type epitaxial layer with the semiconductor substrate and a second part disposed at a side of an interface of the first first-conductivity-type epitaxial layer with the second first-conductivity-type epitaxial layer, by setting a concentration of the second element in the second part to be lower than a concentration of the second element in the first part, and setting a thickness of the first part to be in a range from 0.1 μm to 5 μm.

10. The method according to claim 9, wherein forming the first first-conductivity-type epitaxial layer includes setting the concentration of the second element in the first first-conductivity-type epitaxial layer, at the interface with the second first-conductivity-type epitaxial layer, to be at most one tenth of the maximum concentration of the second element in the first first-conductivity-type epitaxial layer.

11. The method according to claim 9, wherein forming the first first-conductivity-type epitaxial layer includes:

performing a first epitaxial growth of the first first-conductivity-type epitaxial layer in a gas atmosphere containing a first gas containing the first element and a second gas containing the second element, performing a first suspension of a supply of the second gas to the gas atmosphere in a midst of the first epitaxial growth of the first first-conductivity-type epitaxial layer, and performing a second epitaxial growth of the first first-conductivity-type epitaxial layer successively in the gas atmosphere to which the supply of the second gas is suspended.

12. The method according to claim 11, wherein performing the first epitaxial growth includes forming the first part, and performing the second epitaxial growth includes forming the second part successively with the first part.

13. The method according to claim 11, further comprising suspending from a start of performing the first epitaxial growth until completion of performing the second epitaxial growth, a supply of the first gas to the gas atmosphere in a midst of epitaxial growth of the first first-conductivity-type epitaxial layer.

14. The method according to claim 13, further comprising setting a concentration of the first element in the first first-conductivity-type epitaxial layer, at the interface with the second first-conductivity-type epitaxial layer, to be at most one tenth of the maximum concentration of the first element in the first first-conductivity-type epitaxial layer.

15. The method according to claim 10, further comprising
cleaning an epitaxial growth furnace used in forming the
first first-conductivity-type epitaxial layer, the epitaxial
growth furnace being cleaned after the first first-conductivity-type epitaxial layer is formed and before
forming the second first-conductivity-type epitaxial
layer is formed, wherein
forming the second first-conductivity-type epitaxial layer
includes forming the second first-conductivity-type
epitaxial layer by epitaxial growth using the epitaxial
growth furnace after the cleaning.

16. The method according to claim 10, wherein
forming the second first-conductivity-type epitaxial layer
includes forming the first first-conductivity-type epitaxial layer by epitaxial growth using an epitaxial
growth furnace different from that used in forming the
first first-conductivity-type epitaxial layer.

17. The method according to claim 9, wherein the second element is any one of boron, titanium, iron, chromium, or vanadium.

* * * * *